(12) United States Patent
Frutschy

(10) Patent No.: US 7,064,004 B2
(45) Date of Patent: Jun. 20, 2006

(54) INDUCTION-BASED HEATING FOR CHIP ATTACH

(75) Inventor: Kristopher J. Frutschy, Phoenix, AZ (US)

(73) Assignee: Intel Corporation, Santa Clara, CA (US)

(*) Notice: Subject to any disclaimer, the term of this patent is extended or adjusted under 35 U.S.C. 154(b) by 7 days.

(21) Appl. No.: 10/748,344

(22) Filed: Dec. 29, 2003

(65) Prior Publication Data
US 2005/0142695 A1    Jun. 30, 2005

(51) Int. Cl.
H01L 21/44 (2006.01)
H01L 21/48 (2006.01)
H01L 21/50 (2006.01)
H01L 21/46 (2006.01)

(52) U.S. Cl. ............ 438/107; 438/109; 438/456

(58) Field of Classification Search ........ 438/107, 438/109, 456
See application file for complete search history.

(56) References Cited

U.S. PATENT DOCUMENTS

| | | | |
|---|---|---|---|
| 5,816,482 A * | 10/1998 | Grabbe | 228/212 |
| 6,153,012 A * | 11/2000 | Rupp et al. | 118/715 |
| 6,288,376 B1 * | 9/2001 | Tsumura | 219/635 |
| 6,379,576 B1 * | 4/2002 | Luo et al. | 216/67 |
| 6,380,531 B1 | 4/2002 | Sugihwo et al. | 250/214.1 |
| 6,423,939 B1 | 7/2002 | Pan | 219/209 |
| 6,608,291 B1 | 8/2003 | Collins et al. | 219/662 |
| 2003/0006489 A1 * | 1/2003 | Fujii et al. | 257/668 |
| 2003/0090282 A1 | 5/2003 | Akram | 324/754 |
| 2004/0052481 A1 | 3/2004 | Seguin et al. | 389/94 |

FOREIGN PATENT DOCUMENTS

JP    2000-260826    * 9/2000

OTHER PUBLICATIONS

Ameritherm Inc., RF Power Supplies For Precision Induction Heating, Sep. 18, 2003, pp. 1-3.
Koyo Thermo Systems Co.Ltd and Mitsui Engineering & Shiping (MES) Co., Press Release, Mar. 18, 2003, pp. 1-2.
Koyo Thermo Systems Co. Ltd, New Products, Semiconductor Equipment, Oct. 2, 2003, pp. 1.
Richard Haimbaugh, Ameritherm Inc., Chapter 2, Theroy of Heating by Induction, 2001 ASM International. pp. 15.

* cited by examiner

*Primary Examiner*—William M. Brewster
(74) *Attorney, Agent, or Firm*—Teddy Patty

(57) ABSTRACT

A method for bonding a semiconductor die to a substrate is described. The method comprises arranging a semiconductor die, an interconnect, and a substrate in a suitable configuration and using induction heating to form the bond.

49 Claims, 2 Drawing Sheets

INDUCTION-BASED HEATING FOR CHIP ATTACH

FIELD OF THE INVENTION

A method for bonding a semiconductor die to a next level package using induction heating is described.

BACKGROUND INFORMATION

Many current electronic systems utilize a semiconductor die attached to a next level package. A current technique for attaching a semiconductor die to a next level package is known as the controlled chip collapse connection, or C4. In the C4 technique, the semiconductor die is bonded to the next level package with interconnects. The interconnects are heated to form the bond, a process commonly known as reflowing. Heating the interconnects is achieved by heating the die, next level package, and interconnects simultaneously in a reflow oven at elevated temperatures.

While this method is effective for bonding the semiconductor die to the next level package, it can result in mechanical stresses in the assembly so produced as a result of differing coefficients of thermal expansion between the semiconductor die and the next level package materials. If the semiconductor die and the next level package have different coefficients of thermal expansion, they will not expand or contract to the same extent when heated or cooled through the same temperature range in the reflow oven. After being removed from the reflow oven and cooling, the resulting assembly can thus suffer from residual mechanical stresses which are greater than desired.

DETAILED DESCRIPTION

Figure 1:
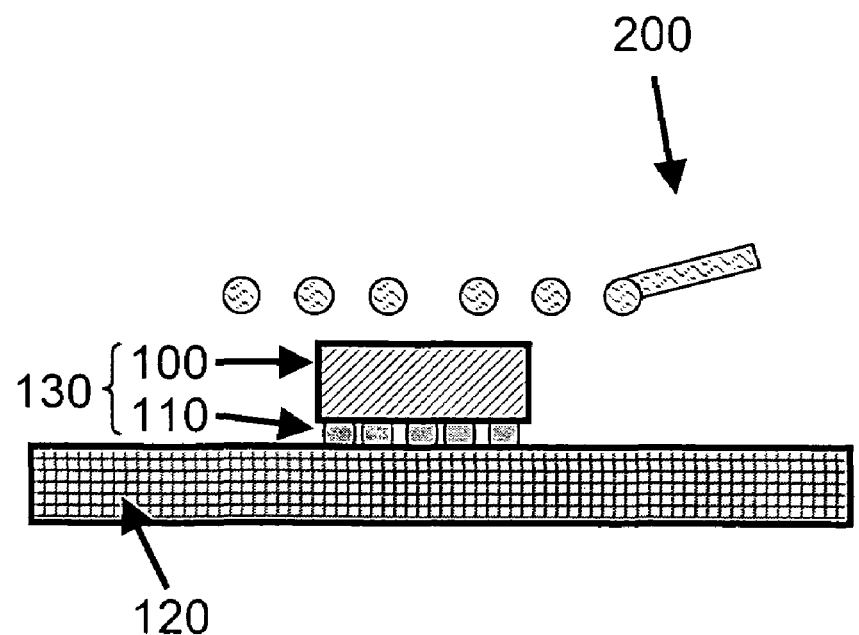
FIG. 1 depicts an embodiment of the present invention for attaching a semiconductor die to a next level package.

In the following description, numerous specific details are set forth. However, it is understood that embodiments may be practiced without these specific details. In other instances, well-known circuits, structures and techniques have not been shown in detail in order not to obscure the understanding of this description.

As used herein, "CTE" means coefficient of thermal expansion. A coefficient of thermal expansion may be described in a number of ways. One description uses the unit of measure "ppm/degree C.", meaning parts-per-million per degree Centigrade. For example, a material having a CTE of 100 ppm/degree C., when heated through a temperature change of 100 degrees Centigrade, will expand by (10,000/1,000,000), equivalent to a 1% expansion. The use of "CTE" and "ppm/degree C." in this disclosure is simply for explanatory purposes and no limittation is implied by the use of these terms.

As used herein, "next level package" refers to any type of packaging bonded to the semiconductor die. A next level package may be a substrate, a flexible substrate, an interposer, a printed wiring board, or any other suitable component.

As noted above, the use of a reflow oven to bond a semiconductor die to a next level package can lead to mechanical stresses which are greater than desired as a result of the different CTEs of the semiconductor die and the next level package. The inventor has discovered that it is possible to use induction heating to bond the semiconductor die to the next level package.

Before specifically describing embodiments of the present invention, it is desirable to present a general overview of induction heating. The following overview is a simplified discussion; greater details can be obtained from a number of readily available texts. One such text is Practical Induction Heat Treating by R. E. Haimbaugh and published by ASM International, ISBN 0-87170-743-8.

Induction heating operates by exposing a work piece to a changing electromagnetic field, also known as a flux, produced by an inductor. Inductors used for induction heating are frequently made of a coil of wires through which an alternating current is passed. The electromagnetic flux produced by the inductor in turn induces current flow, also known as eddy currents, in the work piece. The exact nature of the eddy currents is influenced by characteristics of the inductor, characteristics of the work piece, and the physical relationship between the inductor and the work piece. Important characteristics of the inductor include the frequency of the current applied to it and its shape. Important characteristics of the work piece include its size, magnetic permeability and electrical resistance. Also of importance is the distance between the inductor and the work piece.

The power of the inductor must be chosen so that electromagnetic field generated is large enough to interact with the work piece. The strength of the electromagnetic field weakens with increasing distance. This can also be described as the field decaying as 1/r, where r represents the distance from the inductor. Thus, a stronger electromagnetic field allows the work piece to be heated at a greater distance from the inductor.

The frequency of the current flowing in the inductor must be chosen so that eddy currents are produced in the work piece. The eddy currents in the work piece will encounter resistance, thereby causing the desired heating effect, since the resistance of the work piece to the movement of electrons will result in the electric current being converted to heat. In the field of induction heating, the relationship between inductor frequency and work piece size is discussed in terms of the "reference depth." The reference depth is the depth at which the induced eddy currents decay by 67% of the surface current.

The reference depth depends on the frequency of the alternating current, the electrical resistivity, and the relative magnetic permeability of the work piece. The reference depth decreases with higher frequency. Since induction heating is most effective when the heated part is four times larger than the reference depth, for some work pieces it may be necessary to use very high alternating current frequencies in the inductor. Thus, from this discussion it is apparent that as the size of the work piece is reduced, it is necessary to employ higher frequencies in the inductor in order to maintain effective heating.

Moving now into greater detail, if one simultaneously exposes different materials to the same electromagnetic flux, the heat induced in each material will depend in part on the magnetic permeabilities and electrical resistances of the materials. Thus, materials having differing magnetic permeabilities and/or electrical resistances, when simultaneously exposed to the same electromagnetic flux, may be heated to differing extents. This differential heating can be advantageously employed in bonding a semiconductor die to a next level package.

For example, a semiconductor die, interconnects, and a next level package, when simultaneously exposed to the same electromagnetic flux, may each be heated to differing temperatures or not at all. This process is in contrast with the state-of-the-art reflow method for attaching a die to a next level package, wherein a die, interconnects, and next level package are all exposed to heat and come to a uniform temperature in a reflow oven. Thus, induction heating may advantageously be used to ameliorate the effects of differing coefficients of thermal expansion, since, for example, one can avoid excessively heating the next level package while still heating the semiconductor die and interconnects to an extent sufficient to bond the die to the next level package.

The ability of induction heating to preferentially heat selected elements of a semiconductor die/interconnect/next level package assembly may also be employed to preferentially heat the interconnects relative to the semiconductor die and the next level package. As noted above, the heat induced in a workpiece by an inductor is dependent on the resistivity and magnetic permeability of the workpiece, and on the frequency of the alternating current applied to the inductor. Also recall that the reference depth is dependent on frequency. Thus, it is necessary to choose an inductor frequency which is high enough to produce a reference depth appropriate for heating the interconnects. By choosing an appropriate inductor frequency, one may preferentially induce heating in the interconnects. A typical interconnect is approximately 0.01 cm in size. Thus, the optimal reference depth is 0.0025 cm. This would further ameliorate the mechanical stresses in the resulting assembly.

Induction heating may also be advantageously employed to reduce the amount of time required to bond the semiconductor die with the next level package. Inductor power can be chosen to rapidly heat the die and/or interconnects. Also, the die and/or interconnects can be preferentially heated relative to the next level package, thus reducing the thermal mass which must be heated. Furthermore, since the die can be preferentially heated relative to the next level package, the relatively cool next level package will act as a heat sink to rapidly cool the die, thereby shortening the heating/cooling cycle. In contrast, the use of a state-of-the-art reflow oven requires a greater amount of time to heat the work piece. Using the reflow oven, the next level package is heated as well as the semiconductor die, requiring additional heat input and thus additional time. Furthermore, at the completion of the reflow oven heating cycle the next level package is at an elevated temperature. Cooling the next level package in addition to the die and interconnects requires additional time. Thus, the use of induction heating can reduce the time required to heat and cool the assembly and thereby increase throughput in a manufacturing process.

FIG. 1 depicts an embodiment of the present invention for attaching a semiconductor die to a next level package. In this embodiment, the next level package is a substrate 120. Substrate 120 is an epoxy resin material such as FR4 having a CTE of approximately 16 ppm/degree C., and may contain wiring and/or circuitry. However, other materials may be used and this embodiment of the present invention is not limited to this material. In this embodiment, semiconductor die is a silicon die 100 having a CTE of approximately 3 ppm/degree C., though other materials may be used and this embodiment of the present invention is not limited to this material. In this embodiment, die-interconnect element 130 comprises die 100 having interconnects 110 in the form of an array of solder bumps disposed on one surface. Interconnects 110 may be of a lead-tin alloy and may be on the order of 0.01 cm in size, though other sizes and materials may be used and this embodiment of the present invention is not limited to this material.

Die-interconnect element 130 is arranged with substrate 120 so that interconnects 110 are interposed between die 100 and substrate 120 and in contact with both. Die-interconnect element 130 and substrate 120 are maintained in this arrangement in the presence of inductor 200, where inductor 200 is arranged along that side of die 100 which is opposite from substrate 120. Inductor 200 may be in the form of a flat "pancake" coil. Inductor 200 is energized with an alternating current to produce an electromagnetic flux. The frequency of the alternating current may be on the order of 13.2 megahertz. However, higher or lower frequencies may be used, including frequencies between 1 and 15 megahertz. The electromagnetic flux interacts with die-interconnect element 130, causing it to heat. The rate of heating of die-interconnect element 130 may exceed 50 degrees centigrade per second. Die-interconnect element 130 and substrate 120 are maintained in the presence of the electromagnetic flux for an amount of time sufficient to cause interconnects 110 to bond die 100 and substrate 120 together.

It will be apparent that other configurations of die 100, interconnect 110, and substrate 120 may likewise be treated using this method. A wide variety of possible arrangements may be appropriately treated using the disclosed methods. For example, interconnect 110 may comprise a copper bump, or may comprise a combination of copper and solder. Furthermore, interconnect 110 may be formed on the substrate 120 rather than on the die 100, or multiple interconnects 110 may be formed on both the die 100 and the substrate 120, for example in matching arrays.

It will also be apparent that inductor 200 may take a number of forms and may be energized with currents having frequencies higher or lower than 13.2 megahertz, such as frequencies between 1 and 15 megahertz, and that the rate of heating may be greater or less than 50 degrees centigrade per second. Inductor 200 may be largely flat in form, for example as a pancake coil. Inductor 200 may also be in the form of an chamber which allows the work piece to be placed wholly or partially within it. Depending on the shape of inductor 200, the power applied to it, and the position of inductor 200 relative to die 100, interconnects 110, and substrate 120, it may be advantageous to move inductor 100 relative to die 100, interconnects 110 and substrate 120 so as to provide uniform heating. For example, uniform heating may best be achieved by scanning inductor 100 so as to evenly expose the entire substrate 120 to the electromagnetic flux. Inductor 200 may be energized with frequencies higher or lower than 13.2 megahertz depending on the materials used in the die 100, the substrate 120, and the interconnects 110, and depending on the shape and size of the die-interconnect element 130.

Figure 2:
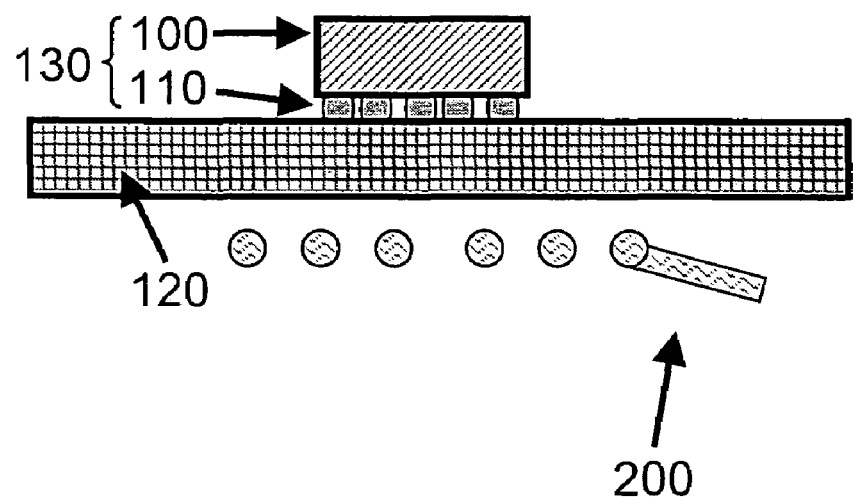
FIG. 2 depicts another embodiment of the present invention for attaching a semiconductor die to a next level package.

FIG. 2 depicts another embodiment of the present invention for attaching die 100 to substrate 120. In this embodiment, die-interconnect element 130 and substrate 120 are maintained in contact in the presence of inductor 200 with the inductor 200 arranged along that side of the substrate 120 which is opposite from die 100. Inductor 200 is energized with an alternating current to produce an electromagnetic flux. If the distance between inductor 200 and die 100 is greater in this configuration than in that depicted in FIG. 1, then the alternating current supplied to the coil in the configuration of FIG. 2 may need to be of a higher power than that used in the configuration of FIG. 1. The electromagnetic flux interacts with die-interconnect element 130, causing it to heat. Die-interconnect element 130 and substrate 120 are maintained in the presence of the electromagnetic flux for an amount of time sufficient to cause interconnects 110 to bond die 100 and substrate 120 together.

Figure 3:
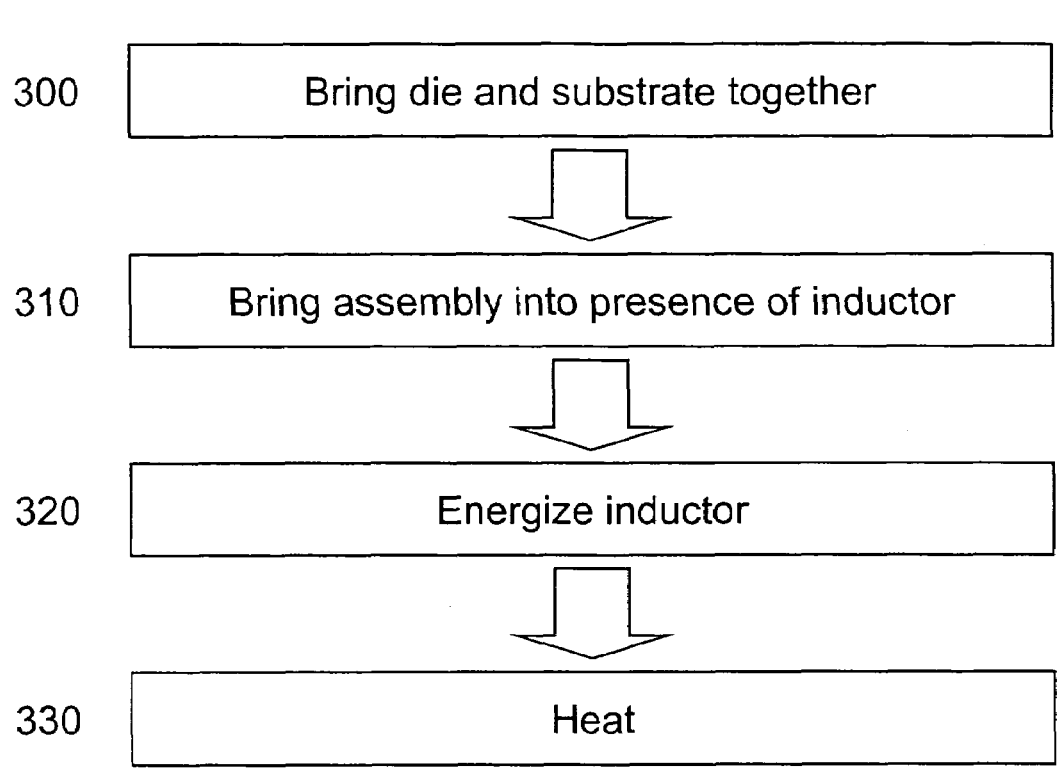
FIG. 3 is a flow chart representing an embodiment of the present invention for attaching a semiconductor die to a next level package.

FIG. 3 is a flow chart representing an embodiment of the present invention for attaching a semiconductor die to a next level package. In this embodiment, in block 300, the die-interconnect element and the next level package are arranged so that interconnects are interposed between die and next level package and in contact with both. In block 310, the die-interconnect element and next level package are maintained in this arrangement and brought into the presence of an inductor. In block 320, the inductor is energized with an alternating current so as to produce an electromagnetic flux. In block 330, the electromagnetic flux acts on the die-interconnect element so as to heat it and bond the semiconductor die to the next level package.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. A method of coupling a semiconductor die with a next level package, comprising:
    providing at least one interconnect;
    arranging the semiconductor die, the next level package, and the at least one interconnect such that the at least one interconnect is disposed so as to be capable of joining the semiconductor die to the next level package;
    generating an electromagnetic flux with an inductor; and
    exposing the semiconductor die to the electromagnetic flux to preferentially induce eddy currents in the semiconductor die to heat the semiconductor die and couple the semiconductor die with the next level package.

2. The method of claim 1, wherein preferentially inducing eddy currents in the semiconductor die is achieved by modulating the frequency of an alternating current such that the at least one interconnect and the next level package is not induced with eddy currents.

3. The method of claim 2, wherein generating an electromagnetic flux comprises providing an alternating electric current having a frequency exceeding 1 megahertz.

4. The method of claim 3, wherein generating an electromagnetic flux comprises providing an alternating electric current having a frequency of approximately 13.2 megahertz.

5. The method of claim 3, wherein the at least one interconnect comprises an array of interconnects.

6. The method of claim 5, wherein the array of interconnects is formed on the semiconductor die.

7. The method of claim 6, further comprising arranging the inductor such that the semiconductor die is interposed between the inductor and the next level package.

8. The method of claim 7, wherein the next level package is a substrate.

9. The method of claim 8, wherein the next level package is a flexible substrate.

10. The method of claim 7, wherein the next level package is an interposer.

11. The method of claim 7, wherein the next level package is a printed wiring board.

12. The method of claim 6, further comprising arranging the inductor such that the next level package is interposed between the inductor and the semiconductor die.

13. The method of claim 12, wherein the next level package is a substrate.

14. The method of claim 13, wherein the next level package is a flexible substrate.

15. The method of claim 12, wherein the next level package is an interposer.

16. The method of claim 12, wherein the next level package is a printed wiring board.

17. A method of coupling a semiconductor die with a next level package, comprising:
    providing at least one interconnect;
    arranging the semiconductor die, the next level package, and the at least one interconnect such that the at least one interconnect is disposed so as to be capable of joining the semiconductor die to the next level package;
    generating an electromagnetic flux with an inductor; and
    exposing the at least one interconnect to the electromagnetic flux to preferentially induce eddy currents in the at least one interconnect to heat the at least one interconnect and couple the semiconductor die with the next level package.

18. The method of claim 17, wherein preferentially inducing eddy currents in the at least one interconnect is achieved by modulating the frequency of an alternating current such that the semiconductor die and the next level package is not induced with eddy currents.

19. The method of claim 18, wherein the heating preferentially heats the at least one interconnect over the semiconductor die.

20. The method of claim 19, wherein generating an electromagnetic flux comprises providing an alternating electric current having a frequency exceeding 1 megahertz.

21. The method of claim 20, wherein generating an electromagnetic flux comprises providing an alternating electric current having a frequency of approximately 13.2 megahertz.

22. The method of claim 20, wherein the at least one interconnect comprises an array of interconnects.

23. The method of claim 22, wherein the array of interconnects is formed on the semiconductor die.

24. The method of claim 23, further comprising arranging the inductor such that the semiconductor die is interposed between the inductor and the next level package.

25. The method of claim 24, wherein the next level package is a substrate.

26. The method of claim 25, wherein the next level package is a flexible substrate.

27. The method of claim 24, wherein the next level package is an interposer.

28. The method of claim 24, wherein the next level package is a printed wiring board.

29. The method of claim 23, further comprising arranging the inductor such that the next level package is interposed between the inductor and the semiconductor die.

30. The method of claim 29, wherein the next level package is a substrate.

31. The method of claim 30, wherein the next level package is a flexible substrate.

32. The method of claim 29, wherein the next level package is an interposer.

33. The method of claim 29, wherein the next level package is a printed wiring board.

34. The method of claim 1, wherein exposing the semiconductor die to the electromagnetic flux to induce eddy currents in the semiconductor die comprises scanning the inductor around the semiconductor die.

35. The method of claim 1, wherein exposing the semiconductor die to the electromagnetic flux to induce eddy currents in the semiconductor die comprises scanning a pancake coil inductor around the semiconductor die.

36. The method of claim 17, wherein exposing the at least one interconnect to the electromagnetic flux to induce eddy currents in the at least one interconnect comprises scanning the inductor around the semiconductor die.

37. The method of claim 17, wherein exposing the at least one interconnect to the electromagnetic flux to induce eddy currents in the at least one interconnect comprises scanning a pancake coil inductor around the at least one interconnect.

38. A method of coupling a semiconductor die with a next level package comprising:
providing at least one interconnect;
arranging the semiconductor die, the next level package, and the at least one interconnect such that the at least one interconnect is disposed so as to be capable of joining the semiconductor die to the next level package;
generating an electromagnetic flux with a pancake coil;
exposing the semiconductor die to the electromagnetic flux to preferentially induce eddy currents in the semiconductor die to heat the semiconductor die and couple the semiconductor die with the next level package.

39. The method of claim 38, wherein the electromagnetic flux induces eddy currents in the at least one interconnect.

40. The method of claim 38, wherein the pancake coil inductor is scanned around the semiconductor die.

41. A method of coupling a semiconductor die with a next level package, comprising:
providing at least one interconnect;
arranging the semiconductor die, the next level package, and the at least one interconnect such that the at least one interconnect is disposed so as to be capable of joining the semiconductor die to the next level package;
generating an electromagnetic flux with an inductor;
scanning the inductor around the semiconductor die while generating an electromagnetic flux;
exposing the semiconductor die to the electromagnetic flux to preferentially induce heating in the semiconductor die to heat the semiconductor die and couple the semiconductor die with the next level package.

42. The method of claim 41, wherein the inductor is a pancake coil inductor.

43. The method of claim 41, wherein the electromagnetic flux induces eddy currents in the at least one interconnect.

44. A method of coupling a semiconductor die with a next level package comprising:
providing at least one interconnect;
arranging the semiconductor die, the next level package, and the at least one interconnect such that the at least one interconnect is disposed so as to be capable of joining the semiconductor die to the next level package;
generating an electromagnetic flux with a pancake coil;
exposing the at least one interconnect to the electromagnetic flux to preferentially induce heating in the at least one interconnect to heat the at least one interconnect and couple the semiconductor die with the next level package.

45. The method of claim 44, wherein the electromagnetic flux induces eddy currents in the semiconductor die.

46. The method of claim 44, wherein the pancake coil inductor is scanned around the at least one interconnect.

47. A method of coupling a semiconductor die with a next level package, comprising:
providing at least one interconnect;
arranging the semiconductor die, the next level package, and the at least one interconnect such that the at least one interconnect is disposed so as to be capable of joining the semiconductor die to the next level package;
generating an electromagnetic flux with an inductor;
scanning the inductor around the at least one interconnect while generating an electromagnetic flux;
exposing the at least one interconnect to the electromagnetic flux to preferentially induce heating in the at least one interconnect to heat the at least one interconnect and couple the semiconductor die with the next level package.

48. The method of claim 47 wherein the inductor is a pancake coil inductor.

49. The method of claim 47, wherein the electromagnetic flux induces eddy currents in the semiconductor die.

* * * * *